United States Patent
Ma

(10) Patent No.: US 6,848,929 B2
(45) Date of Patent: Feb. 1, 2005

(54) LAND GRID ARRAY SOCKET WITH REINFORCING PLATE

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/679,983

(22) Filed: Oct. 6, 2003

(65) Prior Publication Data

US 2004/0097119 A1 May 20, 2004

(30) Foreign Application Priority Data

Nov. 15, 2002 (TW) ...................................... 91218342 U

(51) Int. Cl.[7] .............................................. H01R 13/62
(52) U.S. Cl. ........................................ 439/331; 439/73
(58) Field of Search .................... 439/72, 73, 328–331, 439/526, 525

(56) References Cited

U.S. PATENT DOCUMENTS

| 4,504,105 | A | | 3/1985 | Barkus et al. | |
|---|---|---|---|---|---|
| 4,621,884 | A | | 11/1986 | Berkebile et al. | |
| 5,302,853 | A | | 4/1994 | Volz et al. | |
| 5,344,334 | A | | 9/1994 | Laub et al. | |
| 5,387,120 | A | * | 2/1995 | Marks et al. | 439/331 |
| 5,482,471 | A | * | 1/1996 | Mori et al. | 439/263 |
| 5,973,924 | A | * | 10/1999 | Gillespie, Jr. | 361/735 |
| 6,086,387 | A | * | 7/2000 | Gallagher et al. | 439/71 |
| 6,213,806 | B1 | * | 4/2001 | Choy | 439/331 |

* cited by examiner

*Primary Examiner*—Hien Vu
(74) *Attorney, Agent, or Firm*—Wei Te Chung

(57) ABSTRACT

A land grid array socket (1) includes an insulative base (2) mounted on a printed circuit board, a metal clip (3) pivotably engaged on the base, and a lever (4) for fastening the clip onto the base. The clip (3) and the lever are respectively mounted on two opposite ends of the base to fasten an LGA package. A reinforcing plate (5) made of rigid material is insert molded into the base. The reinforcing plate is generally a rectangular frame, and it includes four integrated sides (51). A substantially rectangular opening (52) is defined among the sides. Therefore, the rigidity of the base is improved, and the deformation or warpage under the pulling forces on two opposite ends of the base is diminished, thereby ensuring steady electrical connection between the contacts pads of the LGA package and respective contacts of the base.

2 Claims, 5 Drawing Sheets

LAND GRID ARRAY SOCKET WITH REINFORCING PLATE

BACKGROUND OF THE INVENTION

1. Field of the Invention

The present invention relates to a land grid array socket for electrical connecting an electronic package such as an integrated circuit (IC) chip with a circuit substrate such as a printed circuit board (PCB), and particularly to a connector adapted for receiving a land grid array (LGA) package therein and electrically connecting the LGA package with a PCB.

2. Description of the Prior Art

An IC package having contact pads arranged on a bottom surface thereof in a land grid array is known as an LGA package. The LGA package has relatively low height, which saves valuable space in electronic assemblies.

Connectors for removably mounting an LGA package on a PCB are known as LGA sockets. An LGA socket typically comprises an insulative base, which is positioned between the LGA package and the PCB. The base defines an array of passageways receiving electrical contacts therein. The contacts correspond with the array of contact pads of the LGA package. Each contact has a pair of opposite free ends that project beyond opposite external surfaces of the base. Prior to mounting of the LGA package, the free ends are spaced apart a predetermined distance. The free ends are respectively engaged with corresponding contact pads of the LGA package, and soldered to contact pads on a mounting surface of the PCB. The LGA package is positioned on the base, and the contact pads of the LGA package rest on the contacts of the base. Thereupon, it is necessary to exert a force upon the LGA package to maintain firm electrical connection between the contacts pads of the LGA package and the respective contacts of the base. The force is powerful enough to maintain the electrical connection between the contacts pads and the contacts.

Various LGA sockets comprises a clip slidably mounted on the base to provide the force are disclosed in, for example, U.S. Pat. Nos. 4,504,105, 4,621,884, 5,302,853, and 5,344,334. Referring to FIG. 5, a typical such LGA socket 9 comprises a clip 93 and a metallic lever 92 respectively mounted to opposite ends of a base 91. The end of the base 91 mounted with the clip 93 defines a pair of troughs mating with a pair of corresponding hooks extending from an end of the clip 93. The opposite end of the base 91 forms a pair of braces holding the lever 92.

Opposite lateral sides of the clip 93 are bent slightly downwardly to form a pair of clasping portions. When the LGA socket 9 is not in use, the clip 93 is rotated down onto the base 91, and the clasping portions rest on a top surface of the base 91.

In use, an LGA package 8 is positioned on the base 91. The clip 93 is rotated down onto the LGA package 8, with the clasping portions resting on the LGA package 8. The lever 92 is rotated down, and engages with a free end of the clip 93. The lever 92 thus presses the clasping portions of the clip 93 onto the LGA package 8.

Because the lever 92 presses down on the clip 93, and the clasping portions of the clip 93 press down on the LGA package 8, the lever 92 simultaneously pulls up the end of the base 91 thereat to counterbalance the pressing forces. In addition, the hooks of the clip 93 tend to pull up the end of the base 91 thereat, to counterbalance the pressing forces of the clasping portions of the clip 93.

Generally, the force required for the clasping portions of the clip 93 to firmly retain the LGA package 8 thereunder is considerable. Accordingly, the pressing force applied by the lever 92 on the clip 93 is also considerable. The result is that the pulling up force of the lever 92 is considerable, and the pulling up force of the clip 93 is also considerable.

Said pulling up forces operate on the opposite ends of the base 91 respectively, and the pressing forces of the clasping portions of the clip 93 operate to press a center portion of the base 91 downward. Because the base 91 is made of plastic, it has limited rigidity. As a result, the opposite ends of the base 91 tend to bend upward and the deformation or warpage of the base is generated. The forces applied by the clasping portions of the clip 93 on the LGA package 8 are decreased. The upshot is that firm and reliable electrical connection between the contacts pads of the LGA package 8 and the contacts of the base 91 is diminished.

In view of the above, a new land grid array socket which overcomes the above-mentioned disadvantages is desired.

SUMMARY OF THE INVENTION

Accordingly, an object of the present invention is to provide a land grid array socket for electrically connecting an electronic package such as an LGA central processing unit (CPU) with a circuit substrate such as a printed circuit board (PCB), wherein the land grid array socket has a base that resists deformation and warpage.

Another object of the present invention is to provide an LGA socket for electrically connecting a land grid array (LGA) package to a printed circuit board (PCB), wherein contacts pads of the LGA package can be firmly and reliably connected with respective contacts of the LGA socket.

To achieve the above-mentioned objects, a land grid array socket in accordance with a preferred embodiment of the present invention comprises an insulative base mounted on a printed circuit board, a metal clip pivotably engaged on the base, and a lever for fastening the clip onto the base. The clip and the lever are respectively mounted on two opposite ends of the base to fasten an LGA package. A reinforcing plate made of rigid material is insert molded into the base. The reinforcing plate is generally a rectangular frame, and it comprises four integrated sides. A substantially rectangular opening is defined among the sides. Therefore, the rigidity of the base is improved, and the deformation or warpage under the pulling forces on two opposite ends of the base is diminished, thereby ensuring steady electrical connection between the contacts pads of the LGA package and respective contacts of the base.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
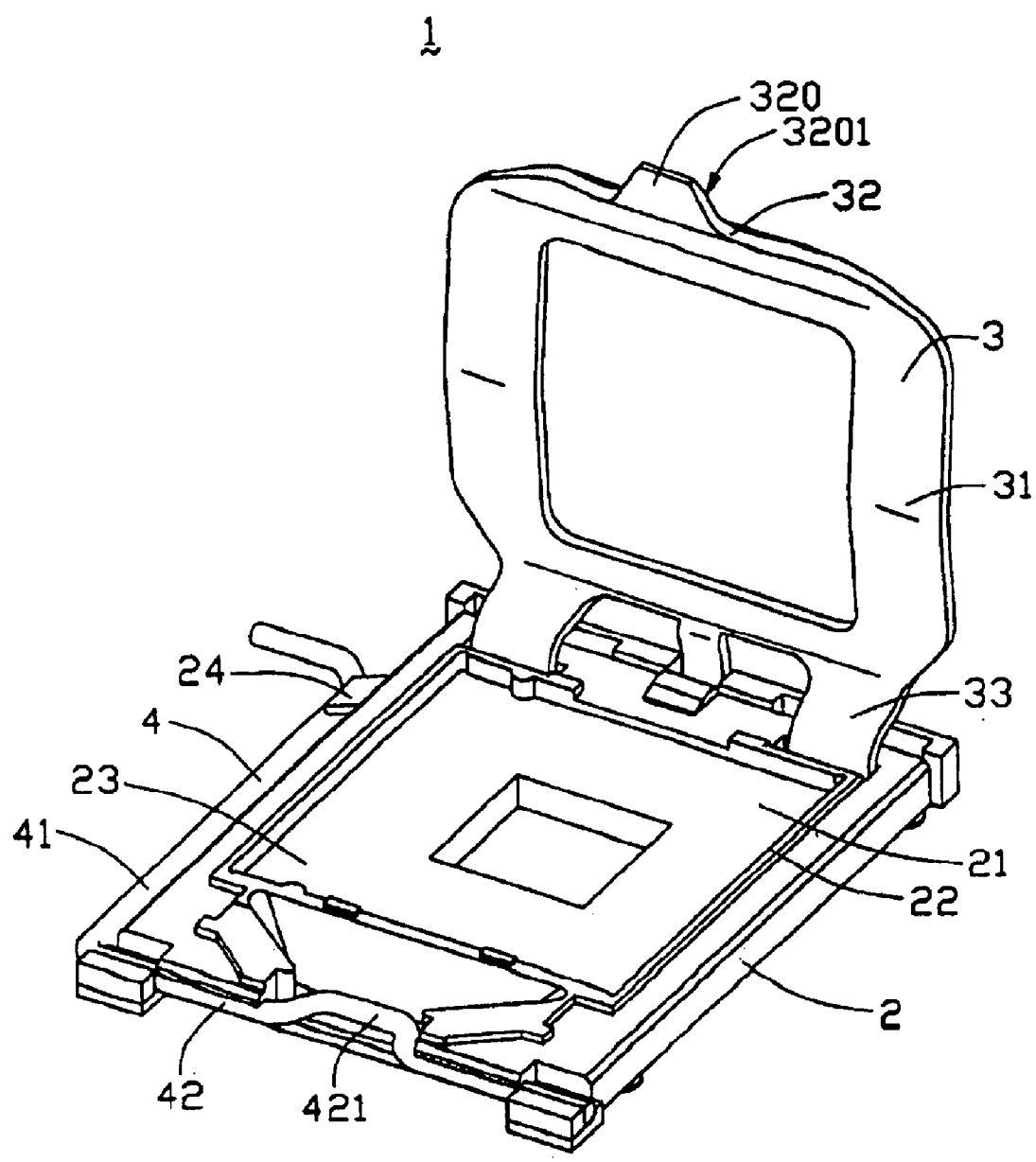
FIG. 1 is an isometric view of a land grid array socket in accordance with the present invention.
Figure 2:
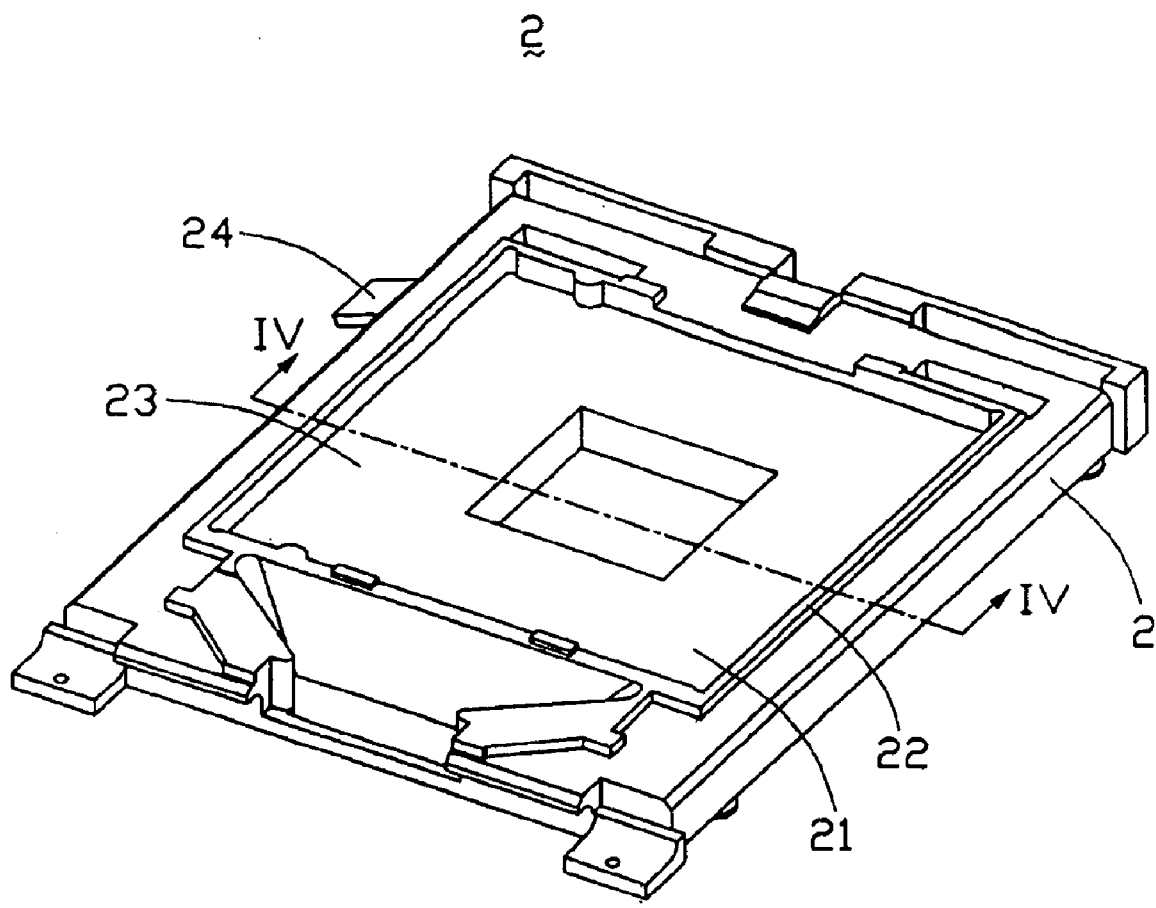
FIG. 2 is a simplified, isometric view of a base of the land grid array socket of FIG. 1.
Figure 3:
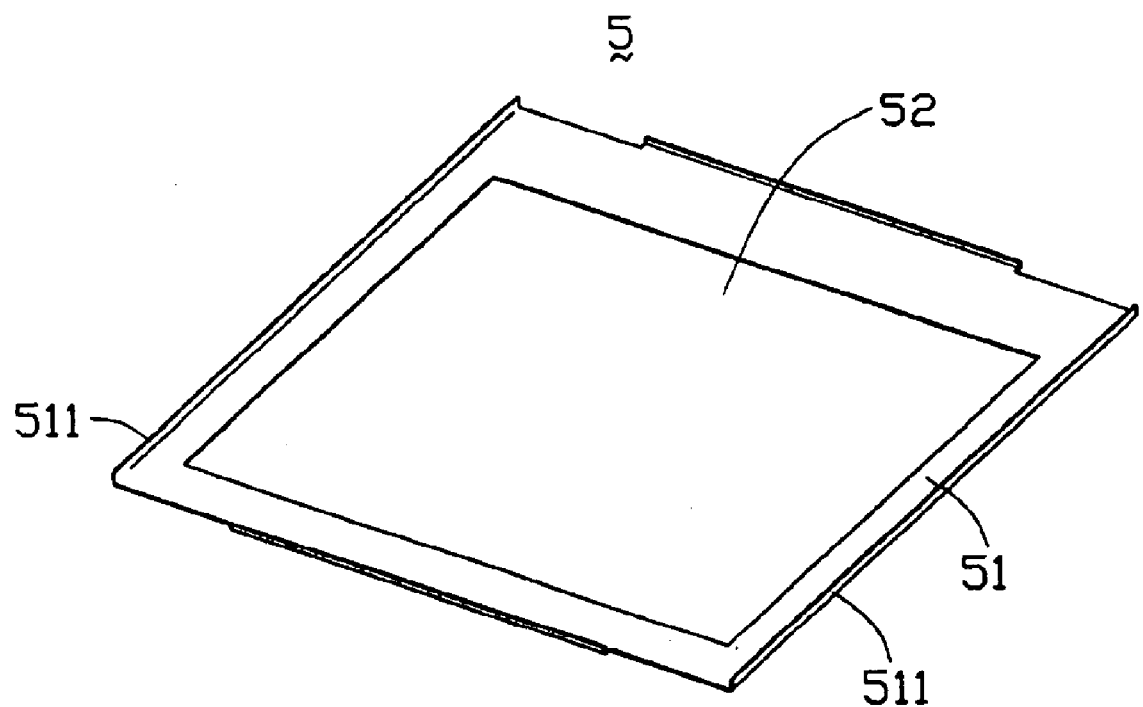
FIG. 3 is an isometric view of an reinforcing plate insert molded into the base in accordance with the present invention.
Figure 4:
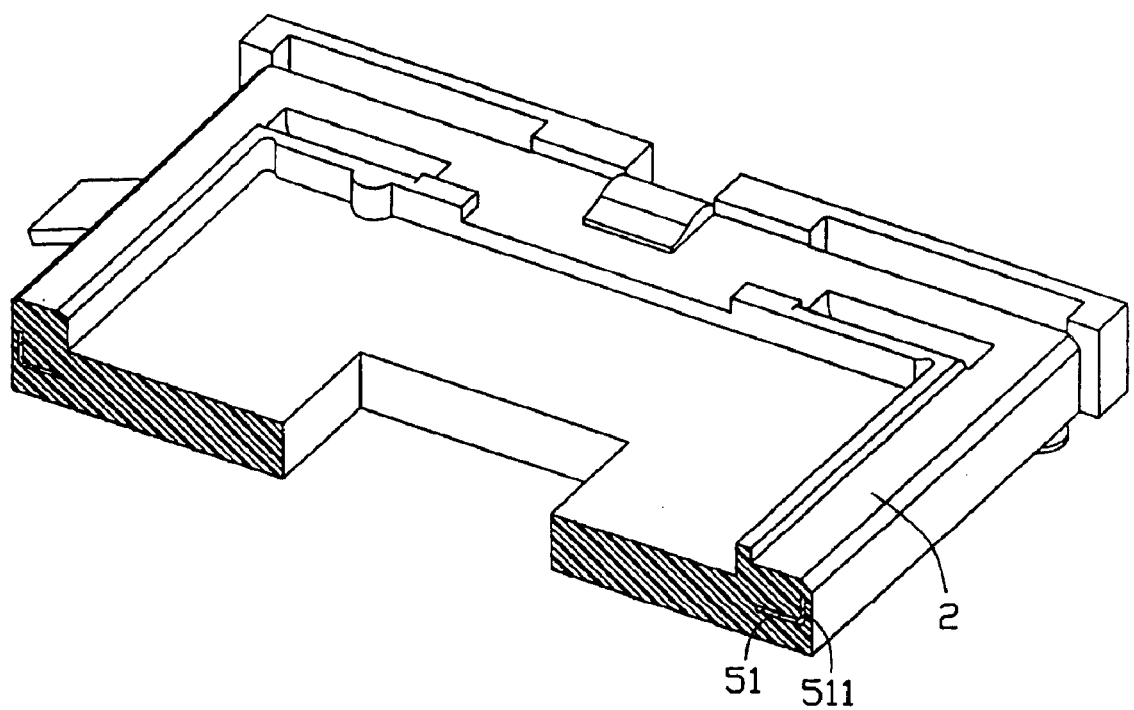
FIG. 4 is a cross-sectional view taken along line IV—IV of FIG. 2, showing the reinforcing plate insert molded into the base.
Figure 5:
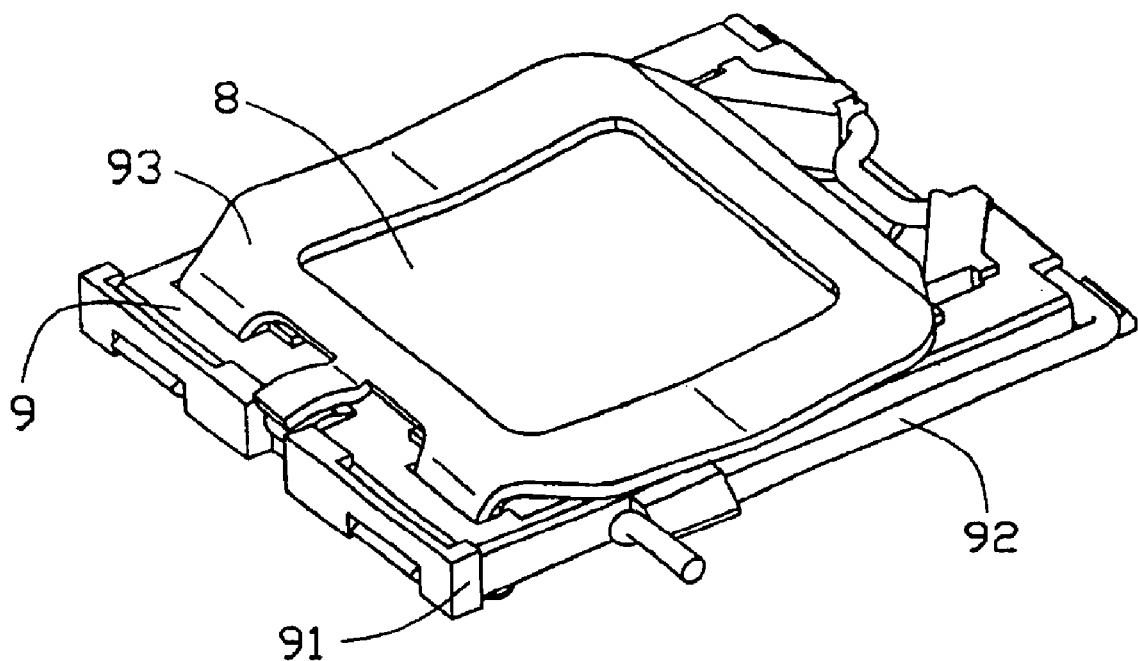
FIG. 5 is an isometric view of a conventional LGA socket with an LGA package received therein.

Referring to FIGS. 1–4, a land grid array (LGA) socket 1 in accordance with the preferred embodiment of the present invention comprises an insulative base 2 mounted on a printed circuit board (not shown), a metal clip 3 and a lever pivotably engaged onto two opposite ends of the base 2 respectively. A reinforcing plate 5 made of rigid material is insert molded into the base 2 for reinforcing the base 2. A land grid package (not shown) is disposed between the base 2 and the clip 3, for connecting with the printed circuit board via the connector 1.

The base 2 is substantially rectangular. A floor 21 is defined in a middle of the base 2, and four side walls 22 are defined around a periphery of the floor 21. The side walls 22 and the floor 21 cooperatively define a substantially rectangular electric area 23 therebetween. A plurality of passageways (not shown) is defined in the floor 21, for receiving corresponding number of electrical contacts (not shown) therein. A slanted locking hook 24 is defined on one side of the base 2.

The reinforcing plate 5 is made of metal in the preferred embodiment, and it alternatively can be made of other rigid material. The reinforcing plate 5 is generally a rectangular frame, which comprises four integrated sides 51. A substantially rectangular opening 52 is defined among the sides 51. Each of the sides 51 defines a baffle 511 depending from external side edge of corresponding side 51. The baffle 511 further resists bending of the reinforcing plate 5 along the direction of the side 51 thereof.

In manufacturing, the reinforcing plate 5 is completely or partly insert molded into the base 2. The opening 52 among the sides 51 of the reinforcing plat 5 is aligned with the floor 21, and the sides 51 are aligned with the periphery portion of the floor 21. Therefore, the passageways defined in the floor 21 will extend through the opening 52 of the reinforcing plate 5.

The clip 3 is generally a rectangular frame. Opposite lateral sides of the clip 3 are bent slightly downwardly to form a pair of clasping portion 31. An engagement portion 32 extends from one end of the clip 3. A free end of the engagement portion 32 forms a substantially flat engagement end 320 having a flat engagement surface 3201, the engagement surface 3201 engaging with the lever 4. A pair of curved mounting portions 33 is formed at an opposite end of the clip 3, for engaging with one end of the base 2.

The lever 4 is substantially a crank, and comprises a driver portion 41 and a driven portion 42 substantially perpendicular to the driver portion 41. An offset fastening portion 421 is formed at a center of the driven portion 42. The driven portion 42 is pivotably engaged with the base 2 at the opposite end to the clip 3.

In use, once the LGA package is positioned on the base 2, the clip 3 is rotated down onto the LGA package, with the clasping portion 31 resting on the LGA package. The lever 4 is rotated down, with the fastening portion 421 engaging and pressing on the engagement surface 3201 of the clip 3. The driver portion 41 of the lever 4 is locked under the locking hook 24 of the base 2. In this position, the clip 3 is pressed by the lever 4, and the clasping portions 31 of the clip 3 press on the LGA package. The force of the clip 3 operating on the LGA package provides firm mechanical and electrical connection between the contacts pads of the LGA package and respective contacts of the base 2.

The rigidity of the base 2 is enhanced by the rigid reinforcing plate 5 attached therein. Thus, the reinforced base 2 resists bending up at two opposite ends when the clasping portions 31 of the clip 3 press on the base 2. Therefore, the deformation or warpage of the base 2 is diminished. Accordingly, the forces that the base 2 applies on the clip 3 and the lever 4 are not diminished, and the force that the clip 3 applies on the LGA package is not diminished. Therefore, firm and reliable electrical connection between the contacts pads of the LGA package and respective contacts of the base 2 is assured.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. An electrical connector comprising:

an insulative base comprising electric area for receiving a plurality of contacts;

a metal reinforcing plate is fully embedded in the base;

a metal clip moveably located about one end of the base; and a lever moveably attached to the other end of the base opposite the one end;

wherein the reinforcing plate is a generally rectangular frame, the frame comprising four sides, an opening being defined among the sides and vertically in alignment with the electric area, a plurality of baffles angularly depending from corresponding sides;

wherein said baffles extend vertically; and wherein the base is substantially rectangular.

2. The connector as claimed in claim 1, wherein said reinforcing plate is located on a periphery area of said base.

* * * * *